United States Patent
Stetsyuk et al.

(10) Patent No.: US 12,150,277 B2
(45) Date of Patent: Nov. 19, 2024

(54) HYBRID HEAT SINK

(71) Applicant: Shenzhen Envicool Technology Co., Ltd., Shenzhen (CN)

(72) Inventors: Viacheslav Stetsyuk, Shenzhen (CN); Ye Wang, Shenzhen (CN); John C. Chai, Shenzhen (CN); Lichuan Wei, Shenzhen (CN)

(73) Assignee: Shenzhen Envicool Technology Co., Ltd., Shenzhen (CN)

( * ) Notice: Subject to any disclaimer, the term of this patent is extended or adjusted under 35 U.S.C. 154(b) by 193 days.

(21) Appl. No.: 18/054,541

(22) Filed: Nov. 11, 2022

(65) Prior Publication Data

US 2023/0156962 A1 May 18, 2023

(30) Foreign Application Priority Data

Nov. 12, 2021 (CN) .......................... 202122782794.X

(51) Int. Cl.
*G06F 1/16* (2006.01)
*H05K 5/00* (2006.01)
(Continued)

(52) U.S. Cl.
CPC ..... *H05K 7/20309* (2013.01); *H05K 7/20318* (2013.01); *H05K 7/20327* (2013.01); *H05K 7/20418* (2013.01)

(58) Field of Classification Search
CPC ........... H05K 7/20309; H05K 7/20318; H05K 7/20327; H05K 7/20418; H05K 7/20336;
(Continued)

(56) References Cited

U.S. PATENT DOCUMENTS 8,014,150 B2 * 9/2011 Campbell .......... H05K 7/20809
165/185
8,059,405 B2 * 11/2011 Campbell ................ F28F 3/02
361/679.53
(Continued)

FOREIGN PATENT DOCUMENTS

| CN | 111642103 A | 9/2020 |
|---|---|---|
| CN | 214102190 U | 8/2021 |
| EP | 4019875 A1 | 6/2022 |

OTHER PUBLICATIONS

The extended European search report of EP application No. 22206645.8 issued on Apr. 13, 2023.

*Primary Examiner* — Anthony M Haughton
(74) *Attorney, Agent, or Firm* — Andrew C. Cheng

(57) ABSTRACT

A hybrid heat sink includes a solid heat dissipation module and a TS heat dissipation module. The solid heat dissipation module includes a solid substrate and solid fins. The solid substrate has a first side surface and a second side surface opposite to each other. The first side surface is for contacting a heat source, and the solid fins are connected to the second side surface. The TS heat dissipation module includes a TS substrate and TS fins fixed to the TS substrate. A receiving cavity for receiving a phase-change working medium is formed in the TS substrate, condensation reflux cavities are formed in the TS fins and are communicated with the receiving cavity. The TS substrate is fixed at a mounting opening of the solid substrate with a side surface of the TS substrate being exposed to the first side surface for contacting the heat source.

20 Claims, 7 Drawing Sheets

(51) Int. Cl.
*H05K 7/00* (2006.01)
*H05K 7/20* (2006.01)

(58) Field of Classification Search
CPC .......... H05K 7/20345; H05K 7/20354; H05K 7/20363; H05K 7/20372; H05K 7/20381; H05K 7/20427; H05K 7/20409; H05K 7/2039
See application file for complete search history.

(56) References Cited

U.S. PATENT DOCUMENTS

| | | | |
|---|---|---|---|
| 8,893,513 B2* | 11/2014 | June | F25B 21/00 62/3.2 |
| 8,991,194 B2* | 3/2015 | Edwards | F25B 21/02 62/3.2 |
| 9,593,871 B2* | 3/2017 | Stanley | F25B 21/04 |
| 10,206,307 B2* | 2/2019 | Lau | H05K 7/203 |
| 2009/0040726 A1 | 2/2009 | Hoffman et al. | |
| 2010/0328890 A1* | 12/2010 | Campbell | F28D 15/0266 29/592.1 |
| 2012/0176794 A1* | 7/2012 | Joung | F21V 29/507 362/249.01 |
| 2019/0148138 A1 | 5/2019 | Molla et al. | |
| 2020/0326130 A1* | 10/2020 | Lan | F28F 13/08 |

* cited by examiner

HYBRID HEAT SINK

FIELD

The application relates to the technical field of heat dissipation of electronics, in particular to a hybrid heat sink.

BACKGROUND

With the continuous development of electronic technology and communication technology, the requirements for the heat dissipation efficiency of heat sinks become increasingly higher. Traditional common heat sinks made of die-cast aluminium have the advantages of good reliability and low machining cost. However, these heat sinks cannot meet the heat dissipation requirements of some high-performance and high-power chips because of their large weight and low heat dissipation efficiency.

Thermosyphon (TS) heat sinks can improve the heat dissipation efficiency and enhance the heat dissipation effect mainly through phase-change heat transfer and gravity circulation of a phase-change working medium in the heat sinks. However, the complex fabrication process, high cost and vulnerability of the TS heat sinks limit wide application of the TS heat sinks.

SUMMARY

To solve the aforementioned problems of the prior art, the main objective of the application is to provide a hybrid heat sink which is good in heat dissipation effect and reliability and low in manufacturing cost.

In one aspect, the present application provides a hybrid heat sink which comprises a solid heat dissipation module and a TS heat dissipation module. The solid heat dissipation module comprises a solid substrate and solid fins, the solid substrate comprising a first side surface and a second side surface which are opposite to each other, the first side surface being configured to contact with a heat source, and the solid fins being connected to the second side surface. The TS heat dissipation module comprises a TS substrate and a plurality of TS fins, a receiving cavity for receiving a phase-change working medium being formed in the TS substrate, condensation reflux cavities being formed in the TS fins, the TS substrate comprising a third side surface and a fourth side surface which are opposite to each other, the TS fins being fixed on the fourth side surface, and the condensation reflux cavities being communicated with the receiving cavity. A mounting opening matched with the TS substrate being formed in the solid substrate, the TS substrate being fixed at the mounting opening, and the third side surface of the TS substrate being exposed to the first side surface of the solid substrate for contacting with the heat source or another heat source.

In some embodiments, the TS substrate comprises a substrate body and a cover plate, a first recess is formed in the substrate body and/or the cover plate, the cover plate is secured to the substrate body to cover the first recess to thereby form the receiving cavity between the substrate body and the cover plate, the substrate body is fixed at the mounting opening, and a surface of a side, away from the substrate body, of the cover plate acts as the fourth side surface.

In some embodiments, a plurality of communicating slots is formed in the cover plate of the TS substrate, and the condensation reflux cavities are communicated with the receiving cavity through the communicating slots respectively.

In some embodiments, a plurality of support members is disposed in the receiving cavity at intervals.

In some embodiments, the support members are formed from one of the substrate body and the cover plate to abut on the other of the substrate body and the cover plate. Preferably, the support members are integrally formed from one of the substrate body and the cover plate to be fixed with the other of the substrate body and the cover plate. Alternatively, the support members can be formed separately and then be fixed to the substrate body and the cover plate.

In some embodiments, the support members are distributed in multiple columns each of which is located between adjacent two of the communicating slots.

In some embodiments, the support embers are post-shaped and distributed in multiple rows and multiple columns.

In some embodiments, a plurality of communicating slots is formed in the fourth side surface of the TS substrate, and the condensation reflux cavities are communicated with the receiving cavity through the communicating slots.

In some embodiments, each of the TS fins comprises a plate and a fin cover, a second recess is formed in the plate or the fin cover, and the plate and the fin cover are engaged with each other to seal the second recess to form the condensation reflux cavity.

In some embodiments, a plurality of support members is disposed in the condensation reflux cavity at intervals and are formed on the plate and/or the fin cover.

In some embodiments, the condensation reflux cavity is provided with a fluid inlet and a fluid outlet, the fluid inlet and the fluid outlet are both communicated with the receiving cavity, and when the TS fins are mounted to the substrate body, the fluid inlet is located above the fluid outlet.

In some embodiments, the hybrid heat sink further comprises a sealing ring disposed at a joint of the TS substrate and the mounting opening.

In some embodiments, the solid substrate or the TS substrate is provided with a sealing groove surrounding the mounting opening, and the sealing ring is disposed in the sealing groove.

In some embodiments, the TS substrate is connected to the mounting opening of the solid substrate in a threaded manner.

In some embodiments, a plurality of through holes is formed at a periphery of the TS substrate, a plurality of threaded holes is formed at a periphery of the mounting opening and a plurality of fasteners extends through the through hole to engage with the threaded holes respectively.

In some embodiments, a step is formed on the solid substrate around the mounting opening, and the TS substrate abuts against the step when installed at the mounting opening.

In some embodiments, the hybrid heat sink further comprises side protective baffles, wherein the side protective baffles are disposed at two opposite sides of the TS fins and the solid fins and parallel to the TS fins and the solid fins.

In some embodiments, the side protective baffles are fixed to the second side face of the solid substrate.

In some embodiments, a plurality of communicating slots is formed in the fourth side surface of the TS substrate, and the condensation reflux cavities are communicated with the receiving cavity through the communicating slots.

In some embodiments, the solid fins and the TS fins are parallel to each other and distributed in a first direction (for example the height direction of the solid substrate), each of the fins is perpendicular to a second direction (for example the width direction of the solid substrate) perpendicular to the first direction, and the TS fins extend from the TS substrate in a third direction (for example the depth direction of the solid substrate) which is perpendicular to the first and second direction.

Compared with the prior art, the hybrid heat sink is provided both a solid heat dissipation module and a TS heat dissipation module, the solid heat dissipation module can be used for heat dissipation of heat sources with low heat dissipation requirements, and heat generated by heat sources with high heat dissipation requirements can be transferred by means of the phase change of a working medium in the TS heat dissipation module and steam diffusion, such that the heat sink has high heat-exchange efficiency and can realize heat dissipation of high-power heat sources of multiple heat sources, thus meeting the heat dissipation requirements of some high-power heat sources and having a good heat dissipation effect with a reduced cost and improved reliability.

REFERENCE NUMBERS 1, solid heat dissipation module; 11, solid substrate; 111, mounting opening; 110, connecting hole; 112, first side surface; 113, second side surface; 12, solid fin; 2, TS heat dissipation module; 21, TS substrate; 211, substrate body; 212, cover plate; 213, support member; 214, through-hole; 215, communicating slot; 216, injection hole; 22, TS fin; 221, plate; 222, support member; 223, fin cover; 23, sealing ring; 3, common heat source; 4, high-power heat source; 5, side protective baffle.

DESCRIPTION OF THE EMBODIMENTS

Embodiments of the application disclose a hybrid heat sink which comprises a solid heat dissipation module and a TS heat dissipation module, wherein the solid heat dissipation module is connected to the TS heat dissipation module. When the hybrid heat sink is used, the TS heat dissipation module can be used for heat dissipation of heat sources with high heat dissipation requirements, and the solid heat dissipation module can be used for heat dissipation of heat sources with low heat dissipation requirements, such that the heat dissipation effect is good, the cost is low, and heat dissipation issue of high-power heat sources of multiple heat sources can be solved. The heat sources are devices that can generate heat such as chips.

Figure 1:
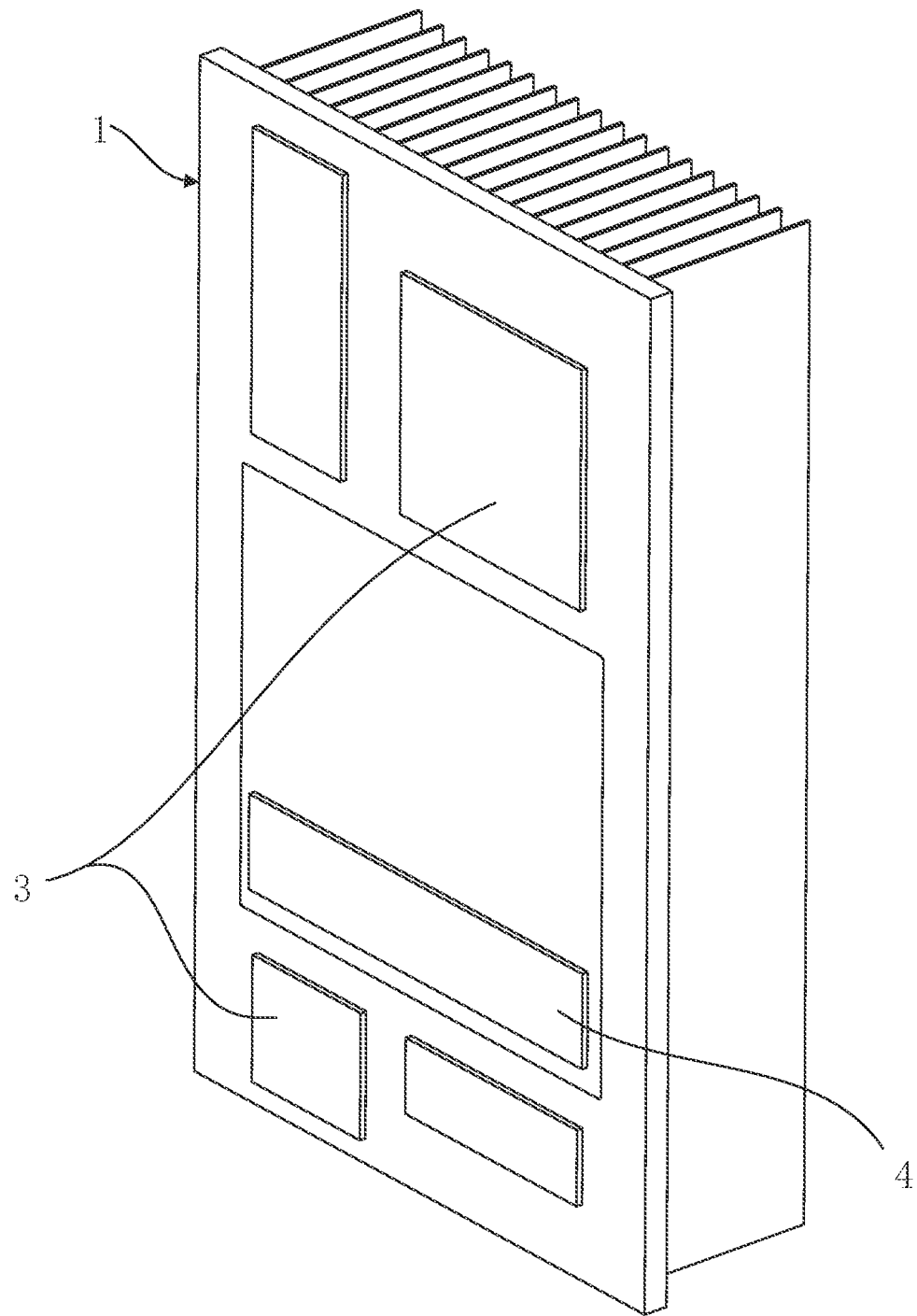
FIG. 1 is a perspective view of a hybrid heat sink according to an embodiment of the application.
Figure 2:
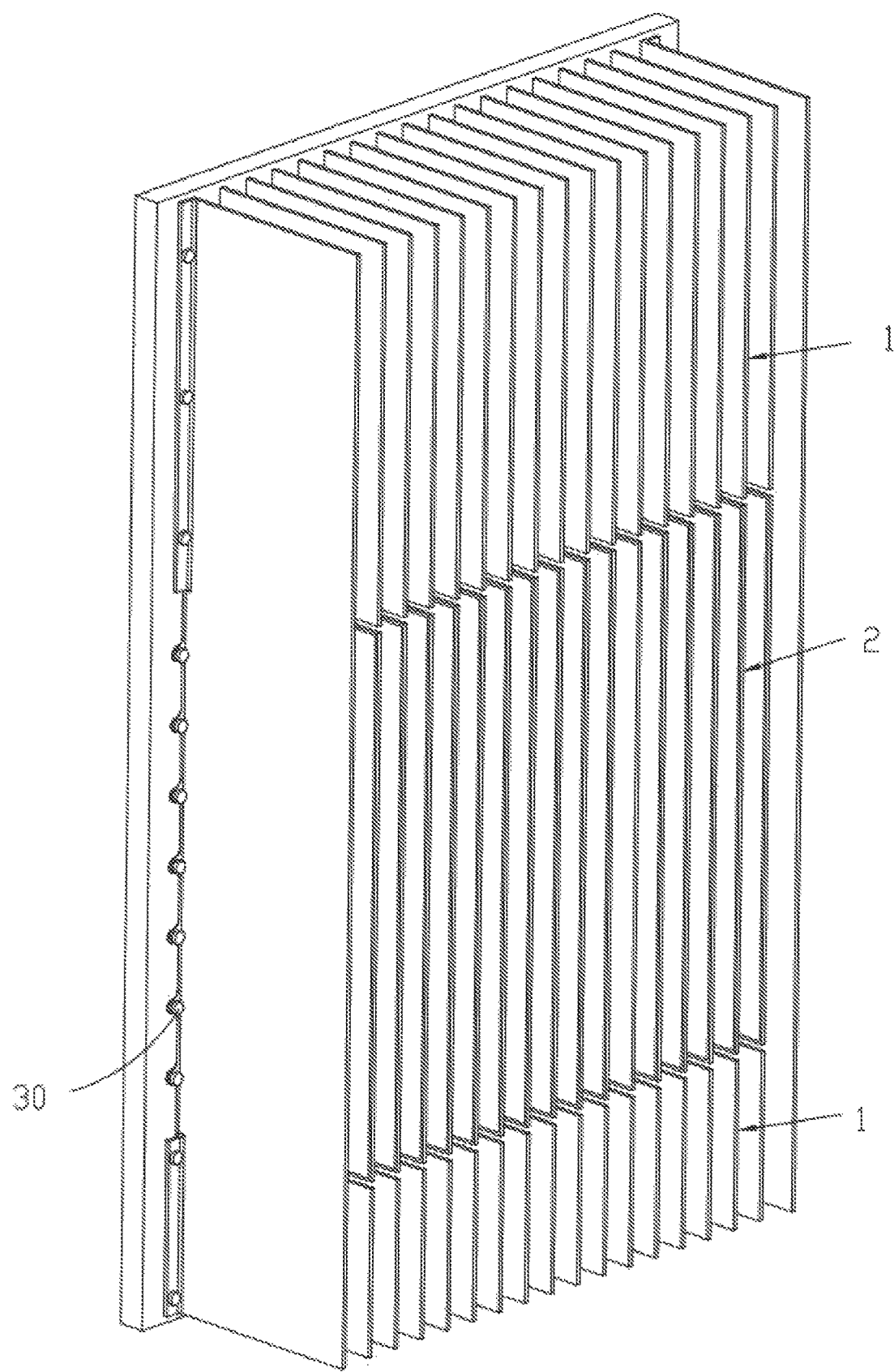
FIG. 2 is another perspective view of the hybrid heat sink of FIG. 1.
Figure 3:
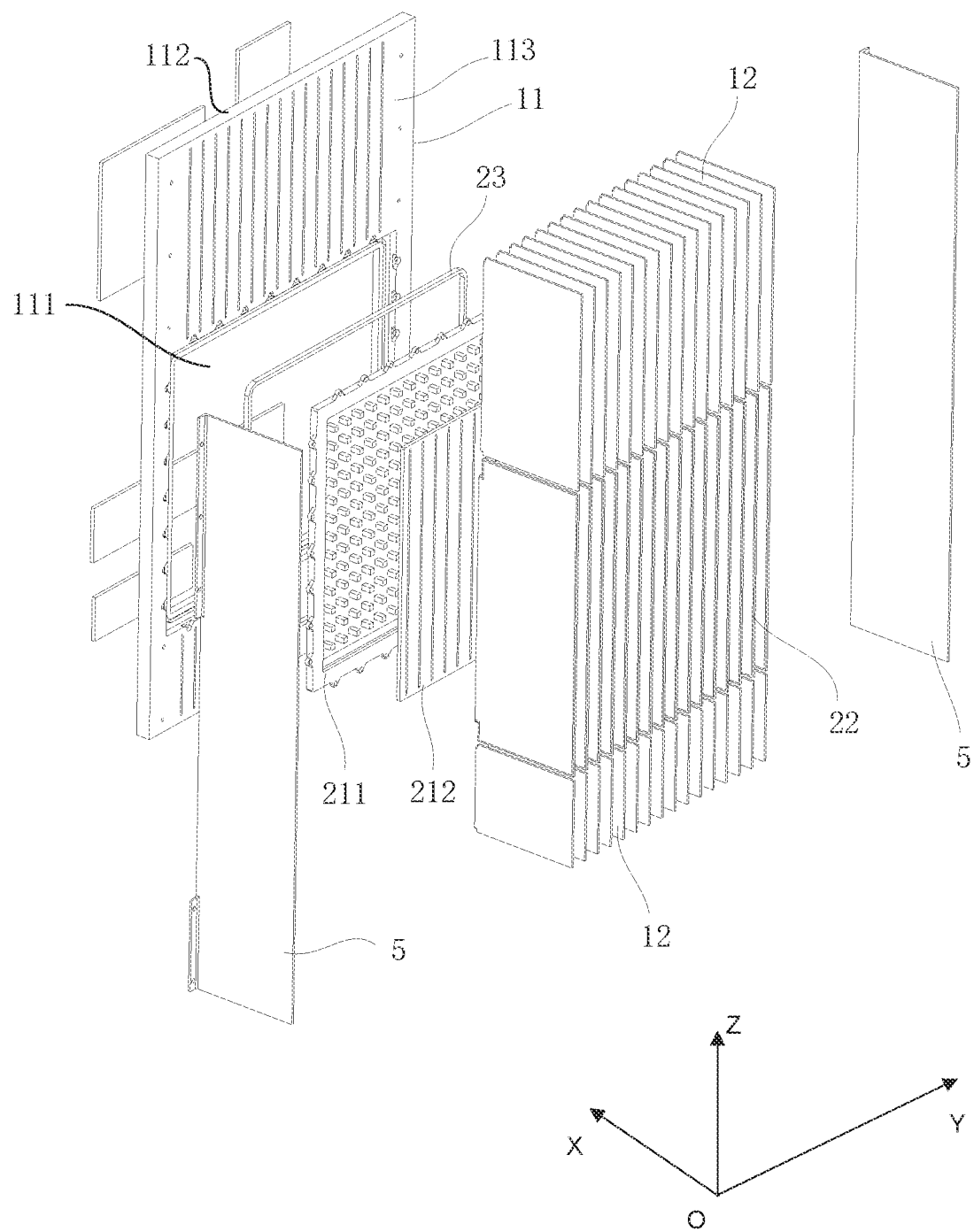
FIG. 3 is an exploded view of the hybrid heat sink of FIG. 1.

FIG. 1 is a perspective view of a hybrid heat sink according to an embodiment of the application, FIG. 2 is a perspective view of the hybrid heat sink viewed from another aspect, and FIG. 3 is an exploded view of the hybrid heat sink. Referring to FIG. 1-FIG. 3, the solid heat dissipation module 1 comprises a solid substrate 11 and solid fins 12, wherein the solid substrate 11 is provided with a mounting opening 111, and a first side surface 112 and a second side surface 113 which are arranged opposite to each other. The first side surface 112 is configured to contact/mount heat sources thereon. The solid fins 12 are connected to the second side surface 113 by welding or other fixing means.

The TS heat dissipation module 2 comprises a TS substrate 21 and a plurality of TS fins 22. The TS substrate 21 is matched with the mounting opening 111. A receiving cavity for receiving a phase-change working medium is formed within the TS substrate 21. The TS substrate 21 has a third side surface and a fourth side surface which are arranged opposite to each other. A condensation reflux cavity is formed within each TS fin 22. When assembled, the TS substrate 21 is mounted to the mounting opening 111 and fixed to the solid substrate 11 in a threaded manner, the third side surface of the TS substrate 21 is exposed to the first side surface 112 of the solid substrate 11 to be connected to one of the heat sources, and the TS fins 22 are fixed to the fourth side surface of the TS substrate 21 by welding with the condensation reflux cavities of the TS fins 22 are communicated with the receiving cavity of the TS substrate 21.

Figure 4:
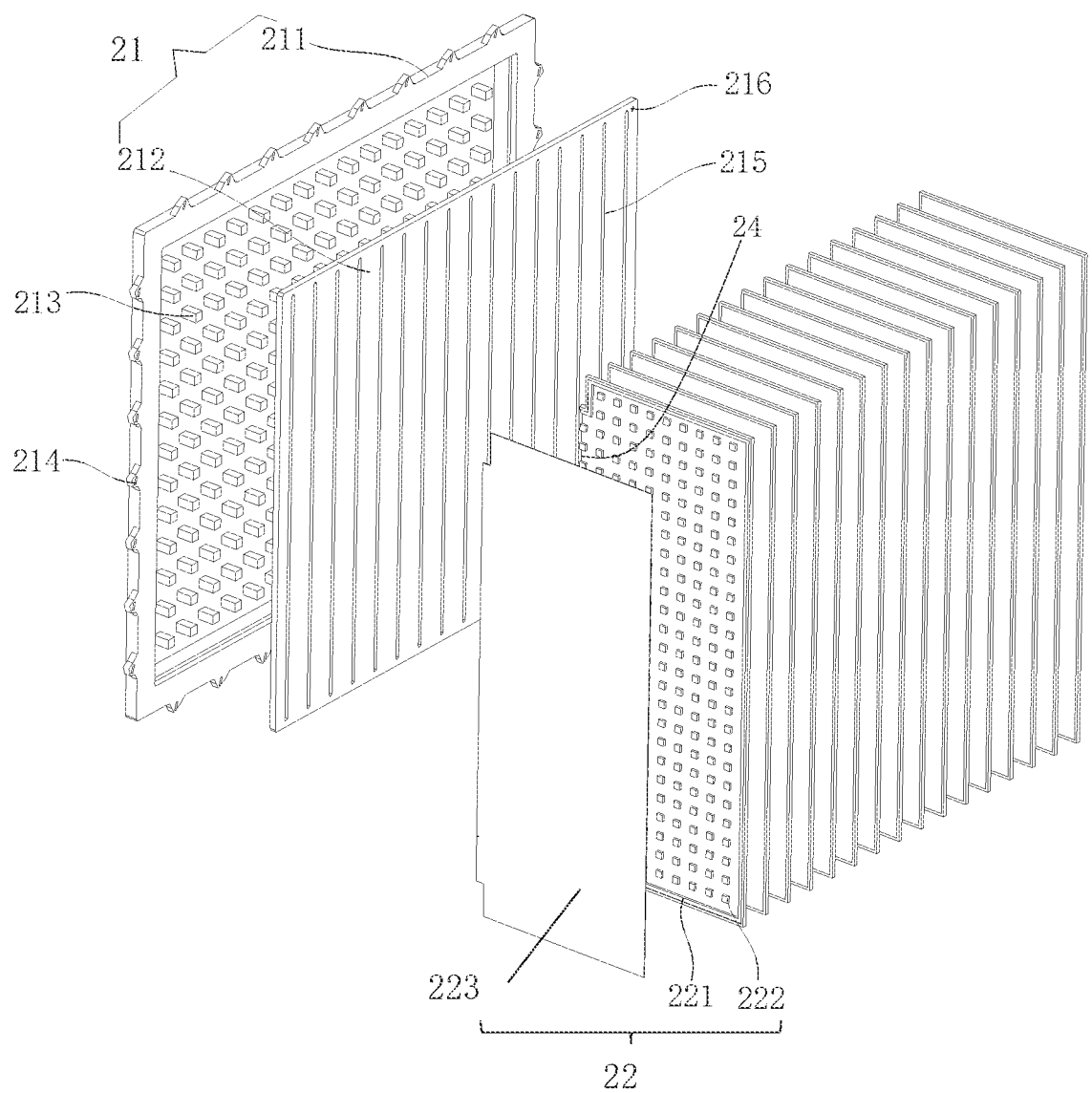
FIG. 4 is an exploded view of a TS heat dissipation module according to an embodiment of the application.

FIG. 4 is an exploded view of the TS heat dissipation module. Referring to FIG. 3, and FIG. 4, the TS substrate 21 comprises a substrate body 211, a cover plate 212, and a plurality of support members 213 disposed between the substrate body 211 and the cover plate 212. The substrate body 211 is configured to be fixed to the mounting opening 111. The surface of the substrate body 211 facing the cover plate 212 is sunk to form a first recess. The cover plate 212 is clamped and covered to the substrate body 211 to seal the first recess to thereby form the receiving cavity. The surface of a side, away from the substrate body 211, of the cover plate 212 is the fourth side surface. Communicating slots 215 and an injection hole 216 are formed in the side, away from the substrate body 211, of the cover plate 212, that is, the communicating slots 215 and the injection hole 216 are formed in the fourth side surface of the TS substrate 21. The phase-change working medium is injected into the receiving cavity through the injection hole 216. The plurality of support members 213 are disposed in the receiving cavity at intervals. In this embodiment, the plurality of support members 213 are integrally formed on or fixed to the substrate body 211. It can be understood that, in other embodiments, the plurality of support members 213 may be integrally formed on or fixed to the cover plate 212; or, some of the plurality of support members 213 are integrally formed on or fixed to the substrate body 211, and some of the plurality of support members 213 are integrally formed on or fixed to the cover plate 212.

In the embodiment, the support members 213 are distributed in multiple columns each of which is located between adjacent two communicating slots 215.

In the embodiment, the support members 213 are post-shaped and distributed in multiple rows and multiple columns.

In this embodiment, the first recess is formed in the substrate body 211, and the cover plate 212 is covered to the substrate body 211 to seal the first recess to form the receiving cavity. It can be understood that, in other embodiments, the first recess may be formed in the cover plate 212, and the substrate body 211 is mounted to the cover plate 212 to seal the first recess to form the receiving cavity.

Since the solid heat dissipation module 1 is generally made of cast aluminum which is different from the material of the TS heat dissipation module 2, the solid heat dissipation module 1 cannot be connected to the TS heat dissipation module 2 by soldering. In this application, the TS heat dissipation module 2 is fixed on the solid heat dissipation module 1 by threaded connection. Further, through-holes 214 are formed in the periphery of the TS substrate 21, connecting holes 110 are formed in the periphery of the mounting opening 111 and correspond to the through-holes 214 in position, and the TS substrate 21 can be located and fixed to the solid substrate 11 through fasteners 30 passing through the through holes 214 to engage with the connecting holes 110 respectively. When assembled, the TS substrate 21 is disposed at the mounting opening 111, and the through-holes 214 are aligned with the connecting holes 110 of the solid substrate 11; then, fasteners 30 such as screws sequentially pass through the through-holes 214 to engage with the connecting holes 110 to thereby connect the TS substrate 21 to the mounting opening 111 in a threaded manner.

When the hybrid heat sink is used, a common heat source 3 (a heat source with low heat dissipation requirements) is disposed on the first side surface 112 of the solid substrate 11, a high-power heat source 4 (a heat source with high heat dissipation requirements) is disposed on the side surface, exposed to the mounting opening 111, of the TS substrate 21, such that heat of the common heat source 3 can be transferred through heat conduction to the solid substrate 11 and then to the solid fins 12, and finally released to the environment, and heat of the high-power source 4 is transferred through heat conduction to the TS substrate 21 and then to the TS fins 22, and finally released to the environment.

Referring to FIG. 4 again, the plurality of TS fins 22 are arranged in a width direction Y of the TS substrate 21, each TS fin 22 is provided with one condensation reflux cavity, and the condensation reflux cavities are communicated with the receiving cavity through the communicating slots 215. Specifically, the length of each TS fin 22 extends in a height direction Z of the TS substrate 21, and the width of each TS fin 22 extends in a thickness direction X of the TS substrate 21, such that the length of the condensation reflux cavity in each TS fin 22 extends in the height direction Z of the TS substrate 21, and the width of the condensation reflux cavity in each TS fin 22 extends in the thickness direction X of the TS substrate 21. The communicating slots 215 are arranged at intervals in the width direction Y of the TS substrate 21 and each of the communicating slots 215 extends in the height direction Z of the TS substrate 21, such that the communicating slots 215 are strip-shaped slots, and the condensation reflux cavity in each TS fin 22 has an opening 24 defined at a side thereof facing the TS substrate 21 and is communicated with the receiving cavity through the opening and a corresponding communicating slot 215.

Further, each TS fin 22 comprises a plate 221, a fin cover 223 and a plurality of support members 222. The surface of the plate 221 facing the fin cover 223 is sunk to form a second recess. Thus, a flange is formed at a periphery of the second recess except the opening 24. That is, the flange surrounds the second recess except the opening 24, Preferably, the opening 24 has a length corresponding to the communicating slot 215. The fin cover 223 is mounted to the flange of the plate 221 to cover the second recess to form the condensation reflux cavity, and the plurality of support members 222 are disposed in the condensation reflux cavity at intervals. In this embodiment, the plurality of support members 222 are formed on the plate 221. It can be understood that, in other embodiments, the plurality of support members 222 may be formed on the fin cover 223; or, parts of the plurality of support members 222 are formed on the plate 221, and the other parts of the plurality of support members 222 are formed on the fin cover 223. In the embodiment, the support members 2222 are post-shaped and distributed in multiple rows and multiple columns.

In this embodiment, the second recess is formed in the plate 221, and the fin cover 223 is covered on the plate 221 to cover the second recess to form the condensation reflux cavity. It can be understood that, in other embodiments, the second recess may be formed in the fin cover 223, and the plate 221 is covered on the fin cover 223 to cover the second recess to form the condensation reflux cavity.

Figure 7:
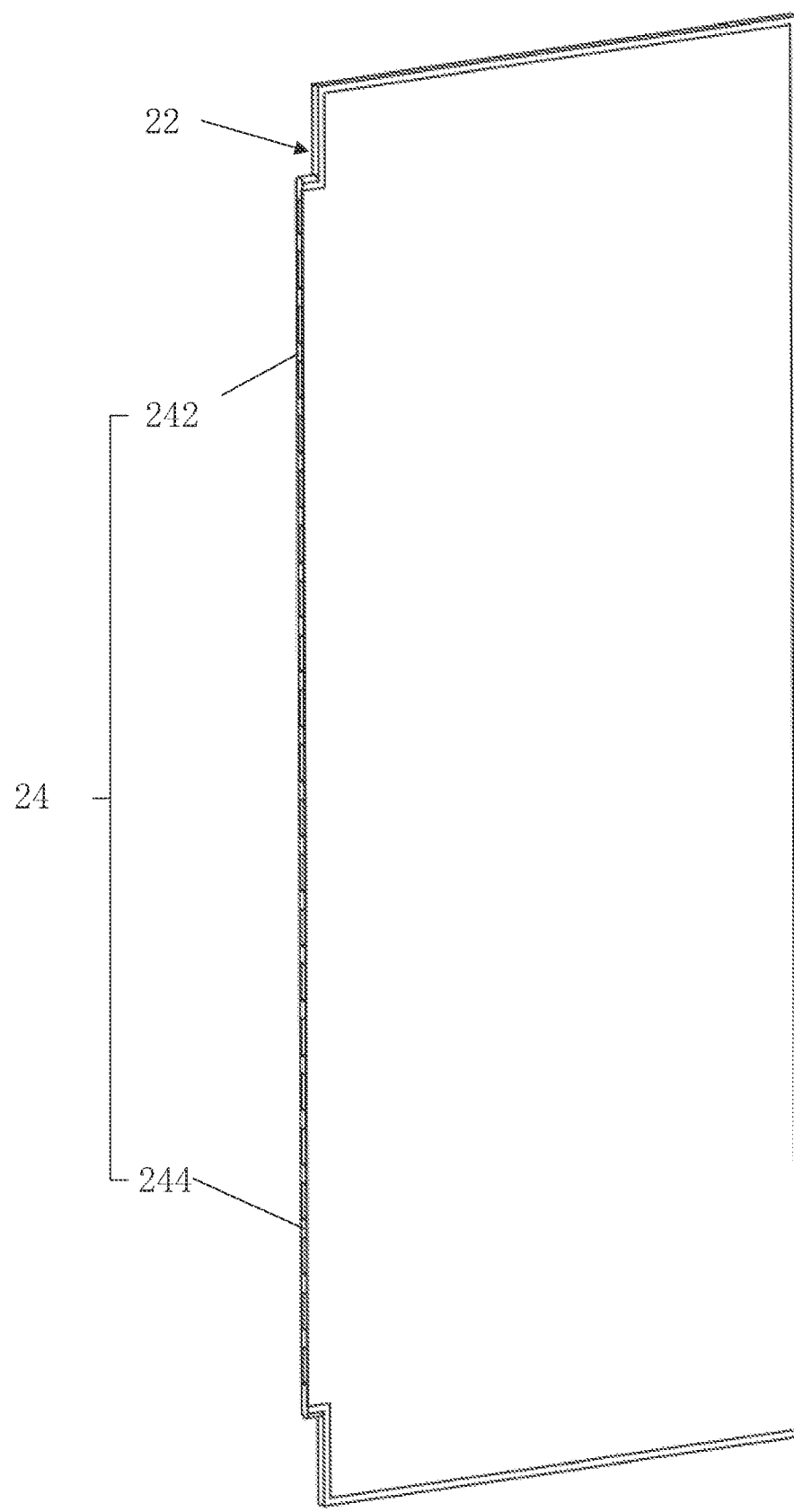
FIG. 7 is a perspective view of a TS fin of the TS heat dissipation module according to an embodiment of the present application.

Referring to FIG. 7, the condensation reflux cavity is provided with a fluid inlet 242 formed by an upper part of the opening 24 and a fluid outlet 244 formed by a lower part of the opening 24, wherein the fluid inlet 242 and the fluid outlet 244 both are communicated with the receiving cavity; and when the TS fins 22 are fixed on the substrate body 211, the fluid inlet 242 is located above the fluid outlet 244 in a perpendicular direction which is parallel to the height direction Z of the TS substrate 21.

The TS fins 22 can be manufactured through machining and welding, blowing, or punch and welding. The present invention has no limitation to the specific manufacturing method of the TS fins 22.

Figure 5:
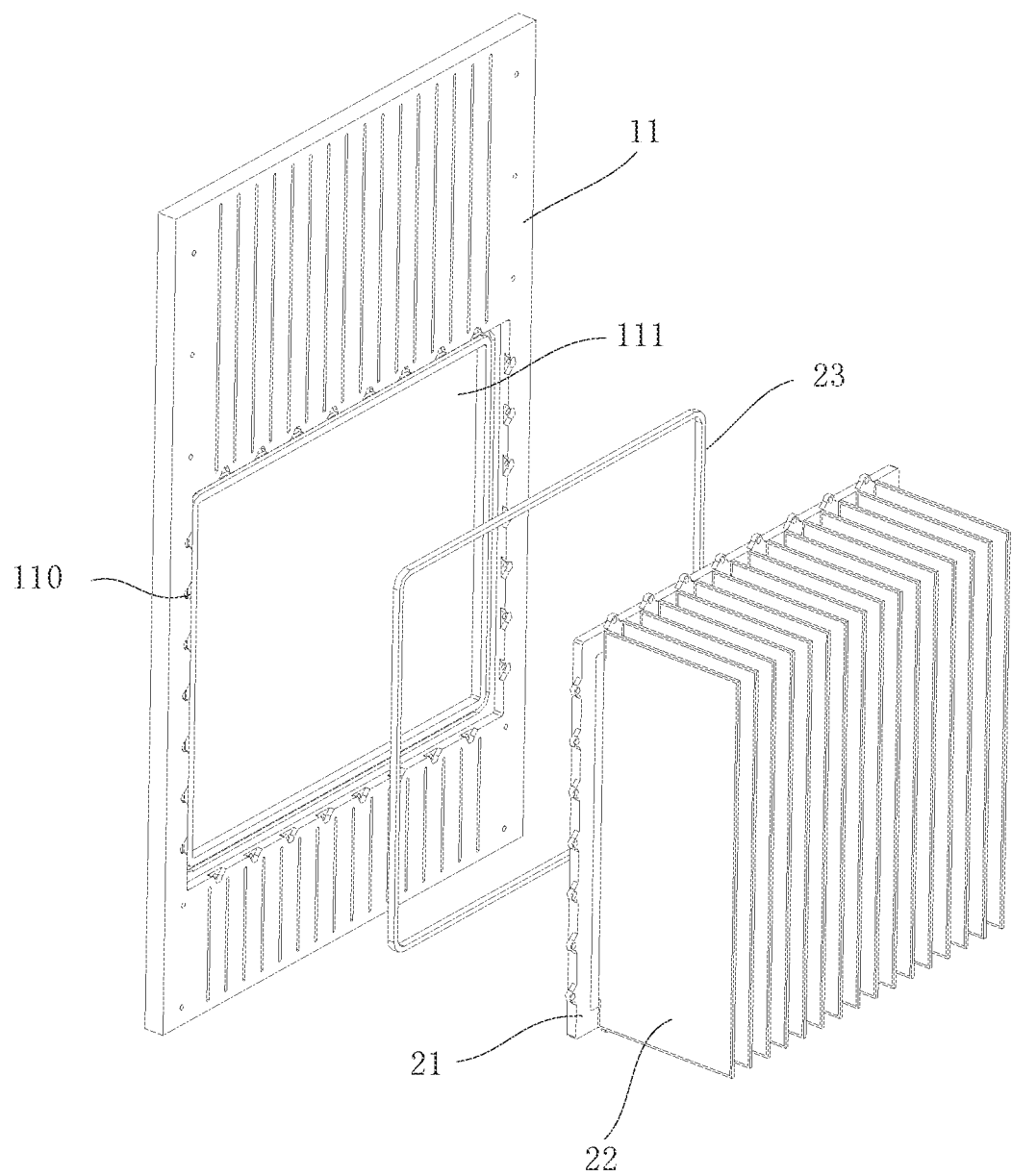
FIG. 5 is a partial exploded view of the hybrid heat sink according to an embodiment of the application.
Figure 6:
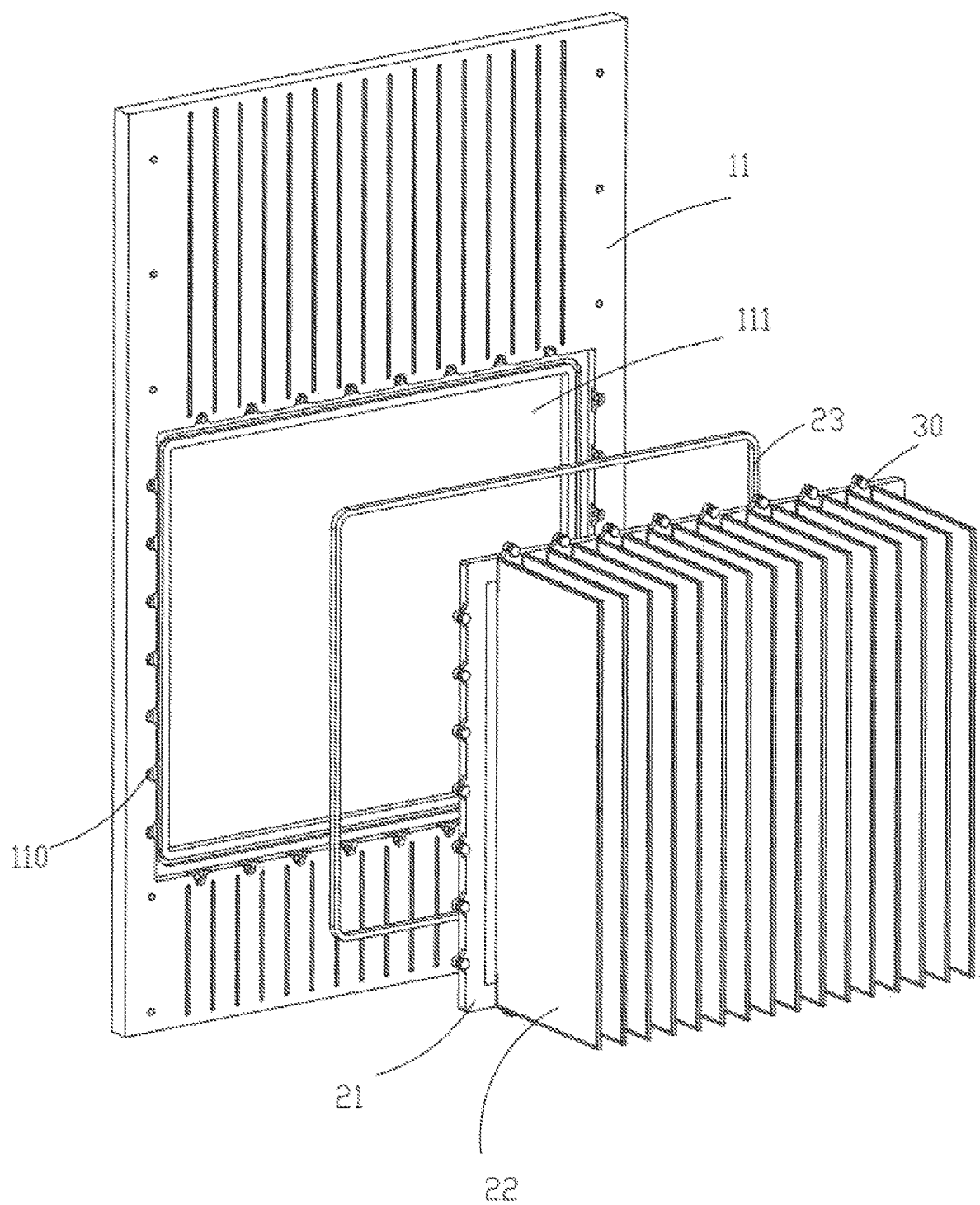
FIG. 6 is similar to FIG. 5 but showing some fasteners mounted in through holes of a TS substrate of the TS heat dissipation module.

Referring to FIG. 3 and FIG. 5, in order to improve the sealing performance of the joint of the TS substrate 21 and the mounting opening 111, the TS heat dissipation module 2 further comprises a sealing ring 23 which is disposed at the joint of the TS substrate 21 and the mounting opening 111, such that the TS substrate 21 can press against the solid substrate 11, and the interior of the heat sink is isolated from the outside. In this embedment, the solid substrate 11 is provided/formed with a step around the mounting opening 111, and when installed at the mounting opening 111, the TS substrate 21 abuts against the step. Through the step, the solid substrate 11 can firmly press the sealing ring, thus further improving the sealing effect. Further, the step is provided with a sealing groove and the sealing ring 23 is disposed in the sealing groove. Through the sealing ring 23 being located in the sealing groove, the sealing effect is further improved. It can be understood that, in other embodiments, the step may be disposed on the TS substrate 21 and be provided with a sealing groove, and the sealing ring 23 is disposed in the sealing groove of the TS substrate 21.

Referring to FIG. 3 again, in this embodiment, the mounting opening 111 is located in the middle of the solid substrate 11, such that the TS heat dissipation module 2 is correspondingly disposed in the middle of the solid substrate 11. Each solid fin 12 comprises a first portion and a second portion, wherein the first portion and the second portion are welded to the second side surface of the solid substrate 11 and are located on upper and lower sides of one corresponding TS fin. It can be understood that, in other embodiments, the TS heat dissipation module 2 may be located at the top of the solid substrate 11, the solid fins 12 are disposed on a lower portion of the solid substrate 11; or, the TS heat dissipation module 2 may be located at the bottom of the solid substrate 11, and the solid fins 12 are disposed on an upper portion of the solid substrate 11.

In this embodiment, the solid fins 12 are connected to the solid substrate 11 and the TS fins 22 are connected to the TS substrate 21 through welding. It can be understood that, in other embodiments, the solid fins 12 may be connected to the solid substrate 11 and the TS fins 22 may be connected to the TS substrate 21 through riveting or aluminum casting; or, the substrates and the fins are formed integrally.

The hybrid heat sink further comprises side protective baffles 5 which are disposed on two opposite sides of the second side surface 113 of the solid substrate 11. Preferably, the side protective baffles 5 are parallel to the TS fins 22 and the solid fins 12. Further, threaded holes are formed in two sides of the solid substrate 11, the side protective baffles 5 are formed with through holes aligning with the threaded holes respectively, and the side protective baffles 5 are fixed to the solid substrate 11 through fasteners 30 such as screws/bolts (not shown) passing through the through holes of the side protective baffles 5 to engage with the corresponding threaded holes of the solid substrate 11. In this embodiment, the side protective baffles 5 are arranged to protect the TS fins 22 and the solid fins 12 against external collisions or debris from two sides, so that the structure of the heat sink is kept in good condition and will not be destroyed.

During operation, heat generated by the common heat source 3 may be transferred through heat conduction to the solid substrate 11 and then to the solid fins 12, and finally released to the environment via heat exchange between the outer surfaces of the solid fins 12 and the environment. When the TS heat dissipation module 2 works, heat generated by the high-power heat source 4 is transferred to the working medium in the receiving cavity through the TS substrate 21, and the working medium in the receiving cavity absorbs heat to boil to generate steam, which is rapidly diffused into the condensation reflux cavities after passing through the communicating slots 215 and the fluid inlet 242 and releases heat to inner surfaces of the condensation reflux cavities and condenses into liquid again. The heat released by the steam exchanges heat with the external environment through the outer surfaces of the TS fins 22, such that the heat of the high-power heat source 4 is finally released to the environment. Meanwhile, the liquid working medium in the condensation reflux cavities flows downwards under the action of gravity to return into the receiving cavity through the fluid outlet 244 and the communicating slots 215 to work cyclically.

In this application, the TS heat dissipation module 2 makes full use of the phase change of the working medium and the steam diffusion inside to transfer heat, such that the hybrid heat sink has high heat-exchange efficiency and can realize heat dissipation of high-power heat sources of multiple heat sources. Moreover, the solid heat dissipation module 1 can be used for heat dissipation of other heat sources with low heat dissipation requirements, so the hybrid heat sink can meet the heat dissipation requirements of some high-power heat sources with a reduced cost and improved reliability.

In the above embodiment, the TS substrate 21 and the solid substrate 11 are assembled in the following manner: the solid substrate 11 is mounted to the TS substrate 21 in a direction from the solid substrate 11 to the TS substrate 21; or, the TS substrate 21 is assembled to the solid substrate 11 in a direction from the TS substrate 21 to the solid substrate 11. The working medium injected into the receiving cavity may be fluorinated liquid such as R134a, R22, R1233zd or the like.

The above embodiments are merely preferred specific ones of the application, and the protection scope of the application is not limited to these embodiments. All variations or substitutions easily obtained by any skilled in the art within the technical scope of the application should fall within the protection scope of the application. Thus, the protection scope of the application should be subject to the protection scope of the claims.

What is claimed is:

1. A hybrid heat sink, comprising:
   a solid heat dissipation module comprising a solid substrate and solid fins, the solid substrate comprising a first side surface and a second side surface which are opposite to each other, the first side surface being configured to contact with a heat source, and the solid fins being connected to the second side surface; and
   a TS heat dissipation module comprising a TS substrate and a plurality of TS fins, a receiving cavity for receiving a phase-change working medium being formed in the TS substrate, condensation reflux cavities being formed in the TS fins, the TS substrate comprising a third side surface and a fourth side surface which are opposite to each other, the TS fins being fixed on the fourth side surface, and the condensation reflux cavities being communicated with the receiving cavity;
   a mounting opening matched with the TS substrate being formed in the solid substrate, the TS substrate being fixed at the mounting opening, and the third side surface of the TS substrate being exposed to the first side surface of the solid substrate for contacting with the heat source or another heat source.

2. The hybrid heat sink according to claim 1, wherein the TS substrate comprises a substrate body and a cover plate, a first recess is formed in the substrate body and/or the cover plate, and the cover plate is secured to the substrate body to cover the first recess to thereby form the receiving cavity between the substrate body and the cover plate; and
   the substrate body is fixed at the mounting opening, and a surface of a side, away from the substrate body, of the cover plate acts as the fourth side surface.

3. The hybrid heat sink according to claim 2, wherein a plurality of communicating slots are formed in the cover plate of the TS substrate, and the condensation reflux cavities are communicated with the receiving cavity through the communicating slots respectively.

4. The hybrid heat sink according to claim 3, wherein a plurality of support members are disposed in the receiving cavity at intervals.

5. The hybrid heat sink according to claim 4, wherein the support members are formed from one of the substrate body and the cover plate to abut on the other of the substrate body and the cover plate.

6. The hybrid heat sink according to claim 4, wherein the support members are distributed in multiple columns each of which is located between adjacent two of the communicating slots.

7. The hybrid heat sink according to claim 4, wherein the support members are post-shaped and distributed in multiple rows and multiple columns.

8. The hybrid heat sink according to claim 2, wherein each of the TS fins comprises a plate and a fin cover, a second recess is formed in the plate or the fin cover, the fin cover is secured to the plate to cover the second recess to thereby form a corresponding one of the condensation reflux cavities between the plate and the fin cover, and an opening is formed between the plate and the fin cover to communicate the corresponding one of the condensation reflux cavities and the receiving cavity.

9. The hybrid heat sink according to claim 8, wherein a plurality of support members are disposed in the condensation reflux cavity at intervals and are formed on the plate and/or the fin cover.

10. The hybrid heat sink according to claim 1, wherein the condensation reflux cavity is provided with a fluid inlet and a fluid outlet, the fluid inlet and the fluid outlet are both communicated with the receiving cavity, and when the TS fins are mounted to the substrate body, the fluid inlet is located above the fluid outlet.

11. The hybrid heat sink according to claim 1, further comprising a sealing ring disposed at a joint of the TS substrate and the mounting opening.

12. The hybrid heat sink according to claim 11, wherein the solid substrate or the TS substrate is provided with a sealing groove surrounding the mounting opening, and the sealing ring is disposed in the sealing groove.

13. The hybrid heat sink according to claim 1, wherein the TS substrate is connected to the mounting opening of the solid substrate in a threaded manner.

14. The hybrid heat sink according to claim 13, wherein a plurality of through holes is formed at a periphery of the TS substrate, a plurality of threaded holes is formed at a periphery of the mounting opening and a plurality of fasteners extends through the through hole to engage with the threaded holes respectively.

15. The hybrid heat sink according to claim 1, wherein a step is formed on the solid substrate around the mounting opening, and the TS substrate abuts against the step when installed at the mounting opening.

16. The hybrid heat sink according to claim 1, further comprising side protective baffles, wherein the side protective baffles are disposed at two opposite sides of the TS fins and the solid fins and parallel to the TS fins and the solid fins.

17. The hybrid heat sink according to claim 16, wherein the side protective baffles are fixed to the second side face of the solid substrate.

18. The hybrid heat sink according to claim 2, wherein a plurality of support members are disposed in the receiving cavity at intervals, and the support members are respectively fixed with the substrate body and the cover plate.

19. The hybrid heat sink according to claim 1, wherein a plurality of communicating slots are formed in the fourth side surface of the TS substrate, and the condensation reflux cavities are communicated with the receiving cavity through the communicating slots.

20. The hybrid heat sink according to claim 1, wherein the solid fins and the TS fins are distributed in a first direction, each of the fins is perpendicular to a second direction perpendicular to the first direction, and the TS fins extend from the TS substrate in a third direction which is perpendicular to the first and second direction.

* * * * *